United States Patent [19]

Marum

[11] Patent Number: 4,928,022
[45] Date of Patent: May 22, 1990

[54] REDUNDANCY INTERCONNECTION CIRCUITRY

[75] Inventor: John R. Marum, Stanford, Calif.

[73] Assignee: TRW Inc., Redondo Beach, Calif.

[21] Appl. No.: 74,608

[22] Filed: Jul. 17, 1987

[51] Int. Cl.⁵ .......................................... H03K 17/693
[52] U.S. Cl. ..................................... 307/241; 307/242;
307/441; 307/465; 307/219; 340/825.83
[58] Field of Search ................. 307/441, 443, 465–469,
307/219, 241, 242; 340/825.01, 825.07, 825.83,
825.85; 371/7–10; 179/18 GF; 379/272

[56] References Cited

U.S. PATENT DOCUMENTS

| | | | |
|---|---|---|---|
| 3,300,587 | 1/1967 | Knight et al. | 379/272 X |
| 4,272,829 | 6/1981 | Schmidt et al. | 307/241 X |
| 4,393,381 | 7/1983 | Seiden | 340/825.83 |
| 4,599,721 | 7/1986 | Murray | 340/825.85 X |
| 4,631,686 | 12/1986 | Ikawa et al. | 340/825.83 X |
| 4,670,749 | 6/1987 | Freeman | 307/465 X |
| 4,698,807 | 10/1987 | Marwood et al. | 371/8 X |
| 4,700,187 | 10/1987 | Furtek | 307/219 X |

OTHER PUBLICATIONS

Bond, "Dual-Redundant Logic System", IBM T.D.B., vol. 15, No. 4, Sep. 1972, pp. 1145-1146.
Kotorman, "Redundancy by Overlaying Partially Good Arrays", IBM T.D.B., vol. 19, No. 6, Nov. 1976, pp. 2012-2013.

Primary Examiner—Stanley D. Miller
Assistant Examiner—D. R. Hudspeth
Attorney, Agent, or Firm—Noel F. Heal; Sol L. Goldstein

[57] ABSTRACT

Switching circuitry for automatically connecting two sets of terminals in two circuit modules, through a larger set of conductors, some of which may be defective or unavailable for other reasons. The circuitry includes two identical switching matrices, each of which receives signals indicative of the availability status of the conductors, and connects the terminals to an available subset of the conductors. Each switching matrix has an array of switching cells arranged in such a manner that a cell will connect a terminal to a conductor unless the conductor is not available, or unless the same terminal has already been assigned to another conductor, or the same conductor has already been assigned to another terminal.

12 Claims, 3 Drawing Sheets

REDUNDANCY INTERCONNECTION CIRCUITRY

BACKGROUND OF THE INVENTION

This invention relates generally to electronic systems that use redundant components as spares and, in particular, to such systems for use in wafer-scale integrated circuits. Wafer-scale integrated circuits employ large portions of or even an entire semiconductor wafer for the fabrication of a single integrated circuit. Accordingly, there is a greater possibility of production defects in the circuit, and an increased need for providing redundancy in the circuit elements. Redundancy may also be employed to provide for replacement of components damaged after the circuit has been placed in service. Many integrated circuits manufactured today contain spare components for rows and columns of memory cells, or for address decoders and the like.

Typically, the spare components are rendered functional by electrically or optically opening fusible links that are formed as part of the circuit. These fusible links complicate the fabrication process and can result in lower production yields. Moreover, the blowing of the fusible links can cause damage to the circuit and can expose the surface of the circuit to contaminants that degrade the performance of the circuit.

There is a need, therefore, for a technique for connecting redundant components without the use of fusible links or similar devices. The present invention satisfies this need.

SUMMARY OF THE INVENTION

The present invention resides in circuitry for automatically connecting a set of n terminals with a selection of terminals selected from a larger set, of m terminals, some of which may not be available for use. Briefly, and in general terms, the invention comprises means for registering which of the m terminals are available, and switching means, coupled to the means for registering which terminals are available, for connecting each of the n terminals to a separate available one of the m terminals. The switching means includes means for ensuring that each of the n terminals is connected to only a selected one of the m terminals, and that each of the m terminals is connected to no more than one of the n terminals.

More specifically, the switching means includes an exchange matrix of switching cells arranged in m rows and a smaller number of staggered columns such that there are n diagonal sets of cells. The means for ensuring that each of the n terminals is connected to only one of the m terminals includes means for connecting each of the n terminals to a diagonal set of switching elements, means for connecting each of the m terminals with a separate row of switching cells, means in each switching cell and responsive to the establishment of a connection from one of the n terminals to one of the m terminals, for generating a diagonal ripple signal for propagation to other cells in the same diagonal set, and means in each of the switching cells and responsive to the detection of a diagonal ripple signal, for preventing establishment of a connection within that cell.

The means for ensuring that each of the m terminals is connected with no more than one of the n terminals includes means for connecting each of the n terminals to a diagonal set of switching elements, means for connecting each of the m terminals with a separate row of switching cells, means in each switching cell, responsive to the establishment of a connection from one of the n terminals to one of the m terminals, for generating a horizontal ripple signal for propagation to other cells in the same row and in earlier columns, and means in each of the switching cells, responsive to the detection of a horizontal ripple signal, for preventing establishment of a connection within that cell.

In the illustrative embodiment of the invention, the means for registering which of the m terminals are available includes a set of m flip-flops, each of which is coupled to a row of the switching cells.

As described in more detail in the specification each of the switching cells includes a first terminal connected to one of the n terminals, such that each of the n terminals is connected to the first terminals of a separate diagonal set of cells, a second terminal connected to one of the m terminals, such that each of the m terminals is connected to the second terminals of a separate row of cells, a switch capable of connecting the first and second terminals, and a status terminal connected to the means for registering which of the m terminals are available, such that each of the cells in any row is provided with the availability status of one of the m terminals. The cell also includes a diagonal output terminal for the output of an inhibiting signal indicating that the n terminal associated with a diagonal set has been connected with an m terminal, a diagonal input terminal for receipt of an inhibiting signal from the diagonal output terminal of another cell, to inhibit further connection of the n terminal to any other m terminal, a horizontal output terminal for the output of an inhibiting signal indicating whether the m terminal associated with a row of cells has been connected with an n input, and a horizontal input terminal for receipt of an inhibiting signal from the horizontal output terminal of another cell in the same row, to inhibit further connection of the m terminal with any other n terminal.

Finally, and most importantly, each switching cell also includes logic means for controlling the switch and for generating output signals at the diagonal and horizontal output terminals, in response to input signals applied to the status terminal and the diagonal and horizontal input terminals. The logic means includes means for turning the switch on in response to the presence of a signal at the status terminal indicating the availability of an m terminal, and the absence of inhibiting signals applied to the diagonal and horizontal input terminals, means for generating an inhibiting signal at the diagonal output terminal in response to either an inhibiting signal received at the diagonal input signal or in response to the turning on of the switch, and means for generating an inhibiting signal at the horizontal output terminal in response to either an inhibiting signal received at the horizontal input signal or in response to the turning on of the switch.

In a more specific application of the invention, the circuitry further includes a plurality of m lines each having first and second ends, the first ends being coupled to the aforementioned set of m terminals and the second ends being coupled to a second set of m terminals Also included is a second switching means identical to the first switching means, and a second set of n terminals. The two switching means couple corresponding ones of the two sets of n terminals together through selected available ones of the m lines.

In a preferred embodiment of the invention, the circuitry is part of a wafer-scale integrated circuit.

It will be appreciated from the foregoing summary that the present invention represents a significant advance in the field of redundancy circuitry, especially as applied to wafer-scale integrated circuitry. In particular, the invention provides a novel technique for connecting one set of terminals to another corresponding set in another circuit module, through a set of conductors of other circuits, some of which may not be available for use. Other aspects and advantages of the invention will become apparent from the following more detailed description, taken in conjunction with the accompanying drawings.

DESCRIPTION OF THE PREFERRED EMBODIMENT

Figure 1:
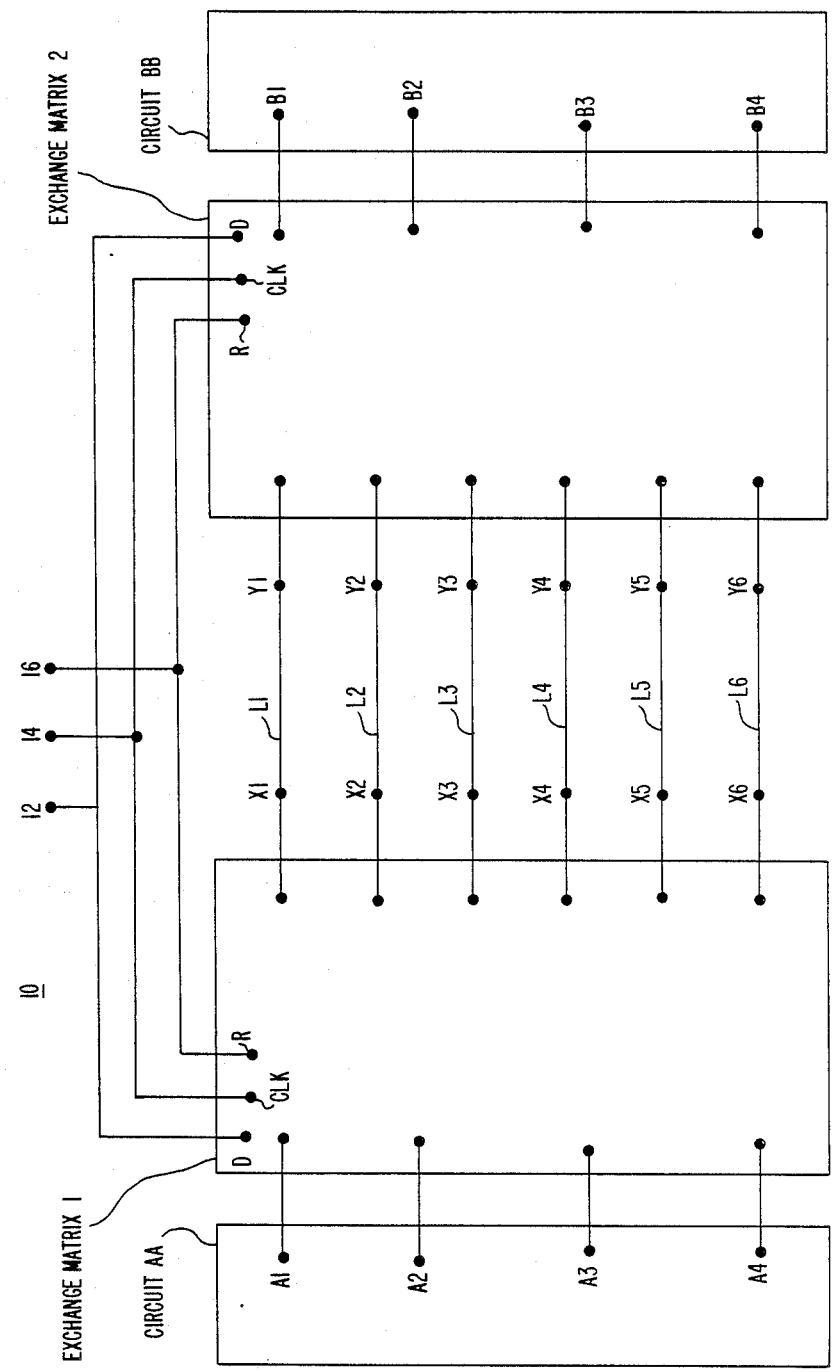
FIG. 1 is a block diagram illustrating one embodiment of the present invention.

As shown in the drawings for purposes of illustration, the present invention is concerned with a technique for automatically configuring or reconfiguring an integrated circuit to employ only components that are not defective. In the past, fusible links have been used for this purpose, but with the inherent disadvantage that they may themselves cause damage to the circuit.

In accordance with the present invention, at least one integrated circuit is structured to include automatic switching means, which is supplied with status information concerning a pool of identical components, including redundant components, and which establishes appropriate connections through only usable ones of the components. The invention is disclosed by way of example in the context of multiple connector lines, some of which are redundant spares, the function of the invention being to establish connections between two circuit modules using only non-defective connector lines.

As shown in FIG. 1, an integrated circuit, indicated by reference numeral 10, includes a circuit AA having terminals A1, A2, A3 and A4, a circuit BB having terminals B1, B2, B3 and B4, and multiple connector lines L1–L6, which serve to couple the terminals A1–A4 to the terminals B1–B4. In this illustrative example, there are six connector lines for making four interconnections between the circuits AA and BB. It will be understood as the description proceeds that the invention is not limited to the function of selecting connector lines, and that the redundant components could be active or passive circuit components of any kind.

Selection of connector lines from the pool L1–L6 of lines is accomplished in FIG. 1 by exchange matrices 1 and 2. Exchange matrix is connected between the terminals A1–A4 of circuit AA and one end of each of the lines L1–L6, indicated at X1–X6. Exchange matrix 2 is connected between the opposite ends of the connector lines, indicated at Y1–Y6, and the terminals B1–B4 of circuit BB. Each matrix 1, 2 has a data terminal D connected to an external terminal 12, a clock terminal CLK connected to an external terminal 14, and a reset terminal R connected to another external terminal 16. Exchange matrix 1 receives status information concerning the lines L1–L6 through the data terminal 12, and automatically establishes connections between the terminals A1–A4 and four of the six connector lines L1–L6. Exchange matrix 2 performs a similar function for establishing connections with the terminals B1–B4. The function and structure of exchange matrix 1 will now be discussed in more detail, and it will be understood that this discussion applies equally well to exchange matrix 2.

Figure 2:
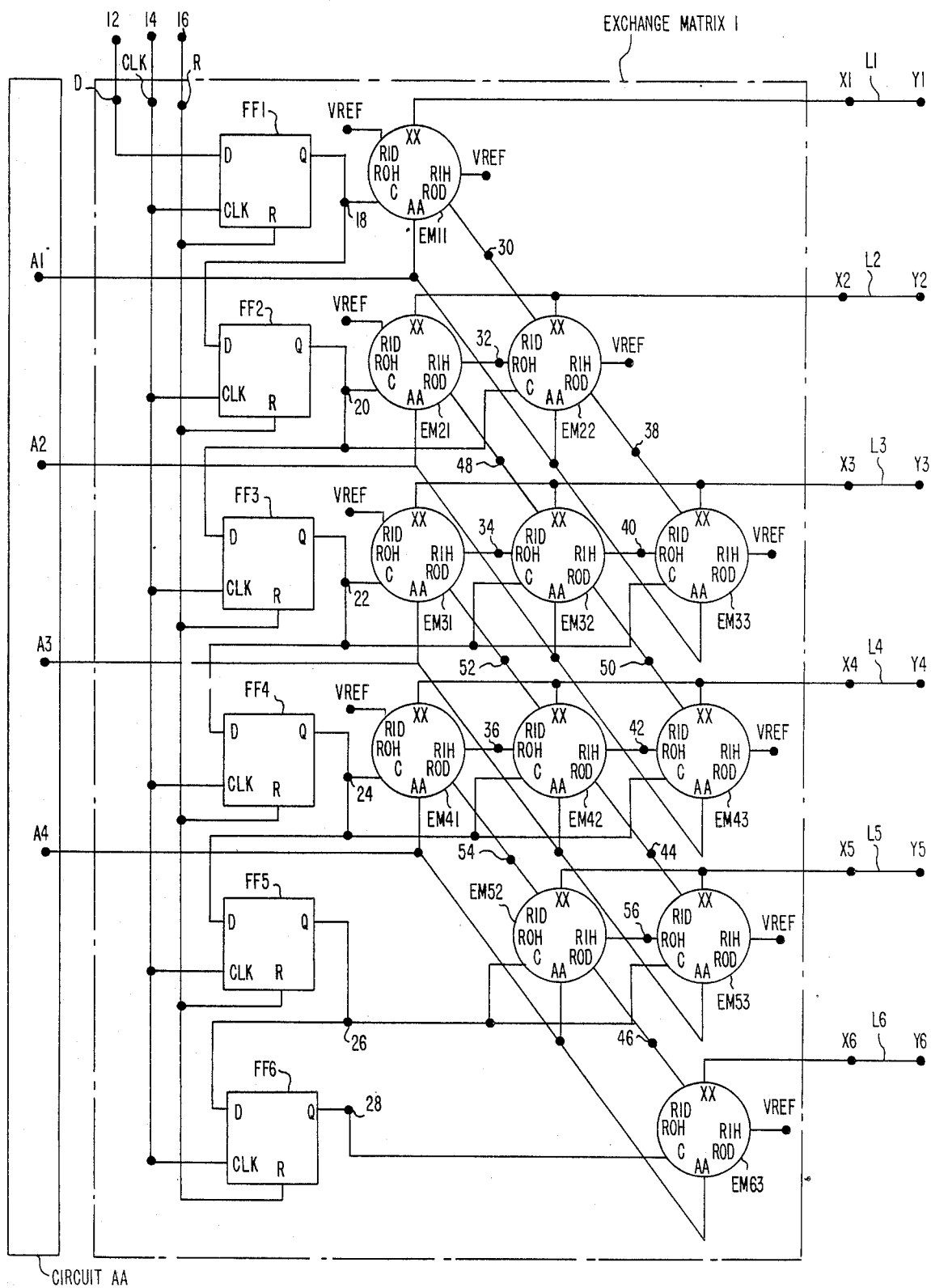
FIG. 2 is a block diagram showing a portion of FIG. 1, including an exchange matrix, in more detail.

Exchange matrix comprises six flip-flops FF1, FF2, FF2, FF3, FF4, FF5 and FF6, shown in FIG. 2 as being arrayed in a single column, and an array of twelve switching cells, indicated by the symbols EM11, EM21, and so forth. The general designation for each cell is EMrc, where r is the row number and c is the column number. There is only one cell EM11 in the first row, adjacent to flip-flop FF1, and there are two cells EM21 and EM22 in the second row. The third and fourth rows each contain three cells, designated EM31, EM32, EM33, and EM41, EM42, EM43. The fifth row contains two cells EM52, EM53 in the second and third column positions, and the sixth row contains only one cell EM63 in the third column position.

The data terminal 12, the clock terminal 14 and the reset terminal 16 are connected to the data, clock and reset terminals of the flip-flops FF1–FF6, which function as a status register for the six connector lines L1–L6. Each of the lines is tested electrically (by circuitry not shown) and its status is determined as usable or non-usable. Usable lines are indicated by a logical "1" stored in the corresponding flip-flop.

At the beginning of operation of the circuit 10, a reset signal is applied to the reset terminal 16 to reset the flip-flops FF1–FF6 to a logical "0" output. Subsequently, status data is applied serially to the data input terminal 12 and clocked, by signals applied to the clocking terminal 14, into the flip-flops FF1–FF6. Based on the states of the flip-flops FF1–FF6, as indicated by their Q output terminals 18, 20, 22, 24, 26, 28, each of the cells EMrc is capable of selectively coupling one of the terminals A1–A4 to one of the end terminals X1–X6 of lines L1–L6.

Figure 3:
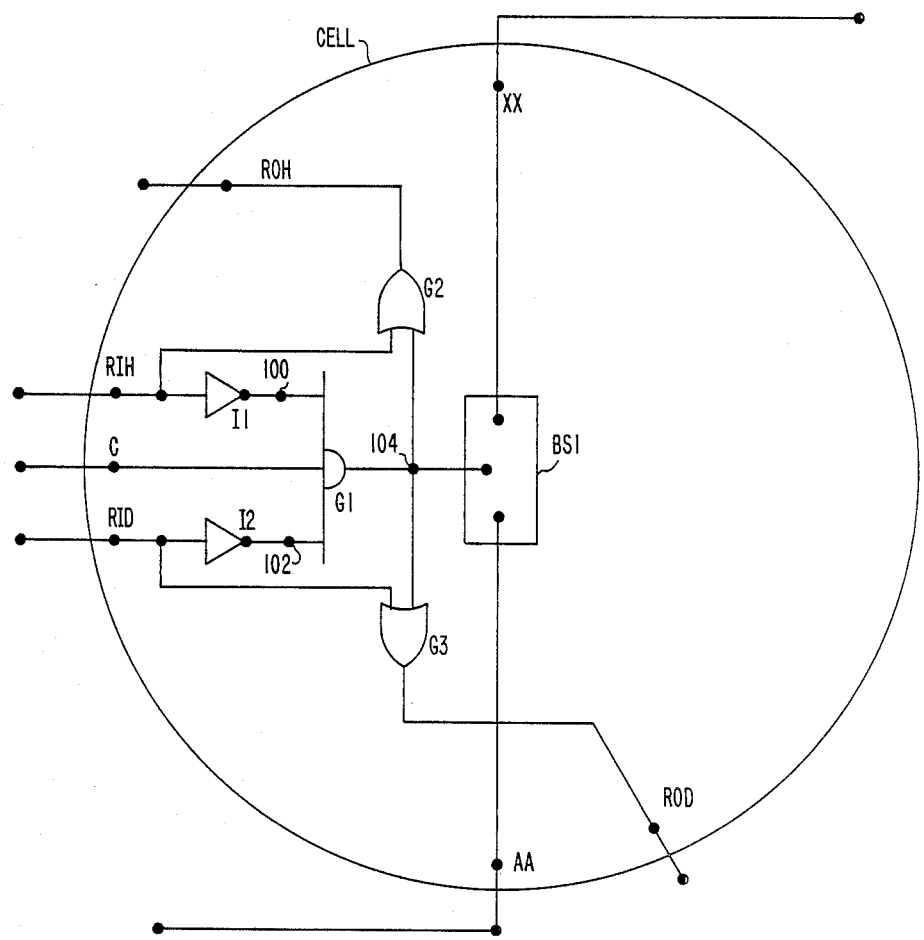
FIG. 3 is a block diagram showing one of a plurality of cells employed in the exchange matrix of FIG. 2.

Each of the cells EMrc is structured identically, and as shown in more detail in FIG. 3. Specifically, each cell includes input/output terminals AA and XX, an input terminal C, a ripple-input-diagonal (RID) terminal, a ripple-input-horizontal (RIH) terminal, a ripple-output-horizontal (ROH) terminal, and a ripple-output-diagonal (ROD) terminal. The cell also has first and second inverter circuits I1 and I2, a three-input AND gate G1, two two-input OR gates G2 and G3 and a bidirectional switch BS1. These components are connected as described in the following paragraph.

Input terminal RIH is connected as an input to OR gate G2 and also to inverter I1, the output of which, at 100, is connected as an input to AND gate G1. Similarly, input terminal RID is connected as an input to OR gate G3, and as an input to inverter I2, the output of which, at 102 is also connected to an input of AND gate G1. The third input of AND gate G1 is derived from the C input terminal. The output of the AND gate G1, indicated at 104, is connected to a control terminal of the switch BS1, and as an input to each of the OR gates G1 and G2. The output of OR gate G2 is connected to the ROH output terminal, and the output of OR gate G3 is connected to the ROD output terminal. Finally, the switch BS1 has its other two terminals connected to the AA and XX terminals respectively.

It will be apparent from FIG. 3 that a logical "1" will be present at the output 104 of the AND gate G1 only if there is a "1" at the C input and a "0" at the RIH and RID inputs. This is the condition that will close the switch BS1 and connect the AA and XX terminals together. The same condition will also generate "1" outputs at the ROH and ROD terminals. OR gate G2 ensures that there will be a "1" at the ROH output terminal if there is a "1" at the RIH input terminal. Similarly, OR gate G3 ensures that there will be a "1" at the ROD output terminal if there is a "1" at the RID input terminal. With this understanding of how each cell operates, it will be more readily apparent how the exchange matrix shown in FIG. 2 functions to connect the terminals A1-A4 to available ones of the lines L1-L6.

The cells in the exchange matrix of FIG. 2 are connected in the following manner. First, the horizontal ripple inputs and outputs are connected along horizontal rows of the matrix. Each cell derives its RIH input from the ROH output terminal of the cell immediately to the right in the row. The right-most cell in each row derives its RIH input from a reference voltage VREF, indicative of a logical "0" condition. The left-most cell in each row has its ROH output terminal open-circuited. The horizontal ripple signals are indicated by reference numerals 32, 34, 36, 40, 42 and 56.

The diagonal ripple inputs and outputs are connected in a similar manner to the horizontal ripple signals, but diagonal rows, sloping downward and to the right in the figure. Thus each cell supplies its ROD output to the RID input terminal of the cell one row below and one column to the right. The first column of cells receives VREF as input to the RID terminals, and the last column of cells has open-circuited ROD terminals. The diagonal ripple signals are indicated by reference numerals 30, 38, 44, 46, 48, 50, 52, and 54.

Terminal A1 is connected to the AA terminal of the first-row cell EM11, and to the AA terminals of the other cells in the same diagonal row, i.e. cells EM22 and EM33. Terminal A2 is connected to the AA terminal of the first cell EM21 in the second horizontal row, and to the AA terminals of each cell in the same diagonal row, i.e. cells EM32 and EM43. Similarly, terminal A3 is connected to the AA terminals of the diagonal row of cells including EM31, EM42 and EM 53, and terminal A4 is connected to the AA terminals of the diagonal row of cells including EM41, EM52 and EM63.

The C terminals of the cells are connected in horizontal rows to the corresponding flip-flops FF1-FF6. More specifically, the Q output of FF1 supplies the C terminal of cell EM11 in the first row of the matrix, the Q output of FF2 supplies the C terminals of cells EM21 and EM22 in the second row of the matrix, and so forth. In general, the Q output of the nth flip-flop FFn supplies the C terminals of the nth row of cells, EMn1, EMn2, and so forth. The X terminals, X1-X6 are also connected to the cells in a row-by-row fashion. Terminal X1 is connected to the XX terminal of the first-row cell EM11, X2 is connected to the XX terminals of the second-row cells EM21 and EM22, and so forth.

It will be observed from the illustrated matrix that terminal A1 is connectable with either line L1 (through cell EM11), line L2 (through cells EM11 and EM22), or line L3 (through cells EM11, EM22 and EM33). Similarly, terminal A2 is connectable with one of three lines L2, L3 and L4, terminal A3 is connectable with one of three lines L3, L4 and L5, and terminal A4 is connectable with one of three lines L4, L5 and L6. The first column of cells is the mechanism by which terminals A1-A4 determine if their "first choice" of lines is available. For example, if FF1 is a "1", indicating that line L1 is available, the C input of cell EM11 is a "1" and the ripple inputs RID and RIH are both "0". Therefore, terminals AA and XX will be connected and cell EM11 will couple terminal A1 to line L1. Cell EM11 will also generate a "1" signal at its ROD output terminal, and this will signal will ripple to the other cells on the same diagonal, i.e. cells EM22 and EM33. The diagonal ripple signal has the effect of inhibiting other cells in the diagonal from making a connection between the AA and XX terminals. Thus, in the example in which A1 is connected to line L1, A1 is prevented from making a connection with L2 and L3 by the diagonal ripple signal.

If connection cannot be made between the AA terminal and the XX terminal in a cell, connection is attempted in the next cell in the same diagonal. For example, if line L1 is not available, terminal A1 could not be connected to line L1, since the C input to cell EM11 would be "0". If line L2 were available, the C terminal of cell EM22 would be a "1" and connection would be made in this cell between terminal A1 and line L2. Simultaneously, cell EM22 would generate a "1" signal on its output ripple terminals ROD and ROH. As discussed, the effect of the ROD signal is to inhibit subsequent cells in the same diagonal from selecting another line for terminal A1. In this example, only cell EM 33 remains in the same diagonal, and the diagonal ripple signal would prevent the cell from connecting A1 to line L3.

The horizon ripple signal is propagated in a reverse direction from any cell in which a connection is closed. In the foregoing example, if cell EM22 establishes a connection between terminal A1 and line L2, a horizontal ripple signal would be transmitted to cell EM21, which would then be prevented from establishing a connection between terminal A2 and line L2.

In general, then, when a connection is established at any of the cells, between a terminal An and an available line Lm, a diagonal ripple signal and a horizontal ripple signal are propagated from the cell in which connection is established. The diagonal ripple signal prevents the same terminal An from being connected to any other line, and the horizontal signal prevents any other input terminal from being connected to the same line Lm.

It will be appreciated that, once the flip-flops FF1-FF6 are loaded with the status information concerning the available lines L1-L6, the first exchange matrix automatically configures itself to connect the terminals A1-A4 with four available ones of the lines L1-L6. Moreover, the other exchange matrix operates in the same manner to connect terminals B1-B6 with the same four available lines. It will be understood that the circuit logic of the cells EM11-EM63 has been described only for purposes of illustration, and may be implemented in a variety of ways without affecting the principles of operation of the invention. Moreover, the circuitry of the exchange matrices used in the invention may be implemented as integrated circuits or using discrete components.

As described above, the present invention represents a significant advance in the field of redundancy systems for electronic components. In particular, the invention provides a novel technique for automatically connecting a plurality of terminals of a circuit module to an equal number of available terminals selected from a larger number of such terminals, some of which may be tagged as defective. The invention may be usefully employed to connect corresponding terminals of two electronic modules through connecting lines selected from a pool of such lines of greater number than the number of terminals. It will also be appreciated that, although an embodiment of the invention has been described in detail for purposes of illustration, various modifications may be made without departing from the spirit and scope of the invention. In this regard, it was mentioned earlier that the invention is not limited to the function of selecting connector lines, and that the redundant components could be active or passive circuit components of any kind. Moreover, although the principles of the invention are well suited to the management of redundant components within an integrated circuit, the same principles could be applied to other physical circuit configurations. Accordingly, the invention is not to be limited except as by the appended claims.

I claim:

1. Circuitry for coupling a first set of n terminals to a corresponding set of terminals selected from a larger set of m terminals, not all of which may be available, the circuitry comprising:
   means for registering which of the m terminals are available; and
   switching means, coupled to the means for registering, for connecting each of the n terminals to any available one of the m terminals, wherein the switching means automatically connects a first of the n terminals to a first available one of the m terminals, selected in a predictable manner, and each next one of the n terminals to a next available one of the m terminals, also selected in a predictable manner, and wherein the switching means includes means for ensuring that each of the n terminals is connected to only a selected one of the m terminals, and means for ensuring that each of the m terminals is connected to no more than one of the n terminals.

2. Circuitry for coupling a first set of n terminals to a corresponding set of terminals selected from a larger set of m terminals, not all of which may be available, the circuitry comprising:
   means for registering which of the m terminals are available; and
   switching means, coupled to the means for registering, for connecting each of the n terminals to a separate available one of the m terminals, wherein the switching means includes means for ensuring that each of the n terminals is connected to only a selected one of the m terminals, means for ensuring that each of the m terminals is connected to no more than one of the n terminals, and an exchange matrix of switching cells arranged in m rows and a smaller number of staggered columns such that there are n diagonal sets of cells.

3. Circuitry as defined in claim 2, wherein the means for ensuring that each of the n terminals is connected to only one of the m terminals includes:
   means for connecting each of the n terminals to a diagonal set of switching elements;
   means for connecting each of the m terminals with a separate row of switching cells;
   means in each switching cell, and responsive to the establishment of a connection from one of the n terminals to one of the m terminals, for generating a diagonal ripple signal for propagation to other cells in the same diagonal set; and
   means in each of the switching cells, and responsive to the detection of a diagonal ripple signal, for preventing establishment of a connection within that cell.

4. Circuitry as defined in claim 2, wherein the means for ensuring that each of the m terminals is connected with no more than one of the n terminals includes:
   means for connecting each of the n terminals to a diagonal set of switching elements;
   means for connecting each of the m terminals with a separate row of switching cells;
   means in each switching cell, and responsive to the establishment of a connection from one of the n terminals to one of the m terminals, for generating a horizontal ripple signal for propagation to other cells in the same row and in earlier columns; and
   means in each of the switching cells, and responsive to the detection of a horizontal ripple signal, for preventing establishment of a connection within that cell.

5. Circuitry as defined in claim 2, wherein:
   the means for registering which of the m terminals are available includes a set of m flip-flops, each of which is coupled to a row of the switching cells.

6. Circuitry as defined in claim 2, wherein each of the switching cells includes:
   a first terminal connected to one of the n terminals, such that each of the n terminals is connected to the first terminals of a separate diagonal set of cells;
   a second terminal connected to one of the m terminals, such that each of the m terminals is connected to the second terminals of a separate row of cells;
   a switch capable of connecting the first and second terminals;
   a status terminal connected to the means for registering which of the m terminals are available, such that each of the cells in any row is provided with the availability status of one of the m terminals;
   a diagonal output terminal for the output of an inhibiting signal indicating that the n terminal associated with a diagonal set has been connected with an m terminal;
   a diagonal input terminal for receipt of an inhibiting signal from the diagonal output terminal of another cell, to inhibit further connection of the n terminal to any other m terminal;
   a horizontal output terminal for the output of an inhibiting signal indicating whether the m terminal associated with a row of cells has been connected with an n input;
   a horizontal input terminal for receipt of an inhibiting signal from the horizontal output terminal of another cell in the same row, to inhibit further connection of the m terminal with any other n terminal; and
   logic means for controlling the switch and for generating output signals at the diagonal and horizontal output terminals, in response to input signals applied to the status terminal and the diagonal and horizontal input terminals.

7. Circuitry as defined in claim 6, wherein the logic means includes:
   means for turning the switch on in response to the presence of a signal at the status terminal indicating the availability of an m terminal, and the absence of inhibiting signals applied to the diagonal and horizontal input terminals;

means for generating an inhibiting signal at the diagonal output terminal in response to either an inhibiting signal received at the diagonal input signal or in response to the turning on of the switch; and means for generating an inhibiting signal at the horizontal output terminal in response to either an inhibiting signal received at the horizontal input signal or in response to the turning on of the switch.

8. Circuitry for coupling a first set of n terminals to a corresponding set of terminals selected from a larger set of m terminals, not all of which may be available, the circuitry comprising:

means for registering which of the m terminals are available;

switching means, coupled to the means for registering, for connecting each of the n terminals to a separate available one of the m terminals, wherein the switching means includes means for ensuring that each of the n terminals is connected to only a selected one of the m terminals, and means for ensuring that each of the m terminals is connected to no more than one of the n terminals;

a plurality of m lines each having first and second ends, the first ends being coupled to the m terminals and the second ends being coupled to a second set of m terminals;

a second switching means identical to the first switching means; and a second set of n terminals;

wherein the two switching means couple corresponding ones of the two sets of n terminals together through selected available ones of the m lines.

9. Circuitry as defined in claim 8, wherein:

the circuitry is part of a wafer-scale integrated circuit.

10. Circuitry for coupling each terminal of a plurality of n terminals of a first circuit to a separate one of a second plurality of n terminals of a second circuit through a selection of n of m conductors, where m is greater than n, the circuitry comprising:

first and second exchange matrices each having an array of switching cells arranged in m rows and (m−n+1) columns of n cells each, the columns being staggered such that there are n diagonal sets of cells of (m−n+1) cells each;

register means associated with each exchange matrix to provide the availability status of the m conductors;

means for associating the status of the m conductors with the m rows of switching cells;

means for connecting each set of n terminals with corresponding diagonal sets of each switching matrix;

means for connecting the m conductors with corresponding rows of cells of each switching matrix;

logic means in each switching cell for connecting one of the n terminals with one of the m conductors, and generating inhibiting signals to prevent the same n terminal from being connected to a different m conductor, or the same m conductor from being connected to a different n terminal; and means for propagating the inhibiting signals from cell to cell within each switching matrix.

11. Circuitry as defined in claim 10, wherein each of the switching cells includes:

a first terminal connected to one of the n terminals, such that each of the n terminals is connected to the first terminals of a separate diagonal set of cells;

a second terminal connected to one of the m conductors, such that each of the m conductors is connected to the second terminals of a separate row of cells;

a switch capable of connecting the first and second terminals;

a status terminal connected to the means for registering which of the m conductors are available, such that each of the cells in any row is provided with the availability status of one of the m conductors;

a diagonal output terminal for the output of an inhibiting signal indicating that the n terminal associated with a diagonal set has been connected with an m conductor;

a diagonal input terminal for receipt of an inhibiting signal from the diagonal output terminal of another cell, to inhibit further connection of the n terminal to any other m conductor;

a horizontal output terminal for the output of an inhibiting signal indicating whether the m conductor associated with a row of cells has been connected with an n input;

a horizontal input terminal for receipt of an inhibiting signal from the horizontal output terminal of another cell in the same row, to inhibit further connection of the m conductor with any other n terminal; and logic means for controlling the switch and for generating output signals at the diagonal and horizontal output terminals, in response to input signals applied to the status terminal and the diagonal and horizontal input terminals.

12. Circuitry for coupling a first set of terminals to a second set of terminals, the circuitry comprising:

means for registering which of the second set of terminals are available; and switching means, coupled to the means for registering, for connecting each of the first set of terminals to any available one of the second set of terminals, wherein the switching means automatically connects a first of the first set of terminals to a first available one of the second set of terminals, selected in a predictable manner, and each next one of the first set of terminals to a next available one of the second set of terminals, also selected in a predictable manner, and wherein the switching means includes means for ensuring that each of the first set of terminals is connected to only a selected one of the second set of terminals, and means for ensuring that each of the second set of terminals is connected to no more than one of the first set of terminals.

* * * * *